US005552726A

United States Patent [19]
Wichman et al.

[11] Patent Number: 5,552,726
[45] Date of Patent: Sep. 3, 1996

[54] HIGH RESOLUTION DIGITAL PHASE LOCKED LOOP WITH AUTOMATIC RECOVERY LOGIC

[75] Inventors: Shannon A. Wichman, Dallas; Uming Ko, Plano, both of Tex.

[73] Assignee: Texas Instruments Incorporated, Dallas, Tex.

[21] Appl. No.: 58,168

[22] Filed: May 5, 1993

[51] Int. Cl.⁶ .................................................. H04L 7/08
[52] U.S. Cl. ........................... 327/149; 327/158; 327/277
[58] Field of Search ................................. 328/155, 133; 307/451, 511, 269, 262, 603, 605; 375/119, 120; 331/1 R, 1 A, 18, DIG. 2

[56] References Cited

U.S. PATENT DOCUMENTS

| | | | |
|---|---|---|---|
| 4,473,805 | 9/1984 | Guhn | 302/511 |
| 4,644,182 | 2/1987 | Kawashima et al. | 302/605 |
| 4,644,184 | 2/1987 | Miyawaki et al. | 302/603 |
| 4,789,996 | 12/1988 | Butcher | 328/155 |
| 4,975,929 | 12/1990 | Apple et al. | 325/119 |
| 5,109,394 | 4/1992 | Hjerpe et al. | 375/119 |
| 5,179,303 | 1/1993 | Searles et al. | 302/603 |
| 5,214,680 | 5/1993 | Gutierrez et al. | 302/603 |
| 5,218,314 | 6/1993 | Efendovich et al. | 325/120 |
| 5,283,631 | 2/1994 | Korner et al. | 302/457 |

*Primary Examiner*—Timothy P. Callahan
*Assistant Examiner*—Dinh T. Le
*Attorney, Agent, or Firm*—Thomas G. Eschweiler; James C. Kesterson; Richard L. Donaldson

[57] ABSTRACT

A phase locked loop circuit 11 includes a phase detection circuit 12, a means for phase adjustment, and a recovery circuit 18. The phase detection circuit 12 monitors the phase relationship between two signals and communicates the phase relationship to the phase adjustment means. The phase adjustment means provides appropriate delay to one of the signals to synchronize the two signals. The recover circuit 18 monitors the phase adjustment means for synchronization failures and provides appropriate notice to the phase adjustment means. The phase locked loop circuit 11 provides improved phase jitter resolution through the phase adjustment means. The circuit provides failure identification and correction through the recovery circuit resulting in improved phase locked loop circuit performance and reliability.

9 Claims, 7 Drawing Sheets

HIGH RESOLUTION DIGITAL PHASE LOCKED LOOP WITH AUTOMATIC RECOVERY LOGIC

CROSS REFERENCE OF RELATED CASES

The following coassigned patent application is hereby incorporated by reference in this patent application:

| Serial No. | Filing Date | TI Docket No. | U.S. Pat. No. |
| --- | --- | --- | --- |
| 07/898,981 | 6/15/92 | TI-17062 | 5,355,037 |

FIELD OF THE INVENTION

This invention relates to electronic circuits and, more particularly, to a digital phase locked loop.

BACKGROUND OF THE INVENTION

Clock frequency requirements of electronics systems are continually increasing. Thus, systems designers must address increasingly complex clock synchronization requirements. For example, in a system which uses application specific integrated circuits (ASICs), it is important to minimize on-chip clock distribution delay and total system clock skew in order to provide safe data transfer between the ASICs. The need for effective high frequency clock synchronization is therefore great.

Figure 1:
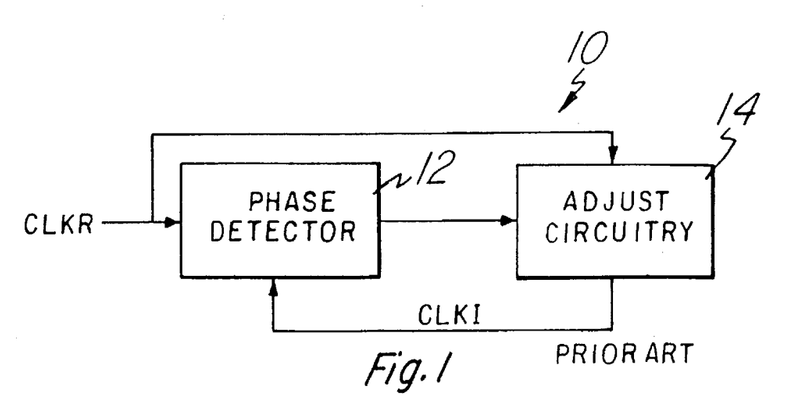
FIG. 1 is a prior art block diagram illustrating a phase locked loop, PLL, circuit 10.

A conventional approach to the problem of clock skew minimization provides a digital phase locked loop (PLL) 10 as shown in FIG. 1 for each IC in the system. Each PLL 10 attempts to eliminate the effects of the on-chip clock distribution delay of the associated IC and typically includes a phase detector 12 and a digital delay line or adjust circuitry 14, each of which has the reference clock CLKR as an input. Adjust circuitry 14 is arranged as a component of the internal clock CLKI distribution path. Internal clock CLKI is fed back as an input to phase detector 12. Phase detector 12 detects information about the phase relationship between reference clock CLKR and internal clock CLKI, and provides this information to adjust circuitry 14. Adjust circuitry 14 adjusts the delay of internal clock CLKI distribution path based on the phase information provided by phase detector 12. This feedback adjustment of internal clock CLKI distribution path delay is continued until internal clock CLKI and reference clock CLKR are acceptably synchronized.

Conventional PLL 10 exhibits an undesirable large phase jitter. Phase jitter is a function of the phase resolution of the phase detector and the step size of adjust circuitry 14. Another limitation of PLL 10 is that if a phase lock condition is not achieved due to various system conditions a failure will occur, however, PLL 10 cannot identify whether a failure has occurred. Therefore the PLL does not provide the synchronization between ASICs during this failure mode. Only a manual reset of PLL 10 will fix this problem.

It is an object of this invention to provide a PLL that provides an improvement in phase jitter resolution over prior art PLL 10. It is another object of this invention to provide a PLL that monitors itself and identifies PLL locking failures and takes appropriate action to address the failure. Other objects and advantages of the invention will become apparent to those of ordinary skill in the art having reference to the following specification together with the drawings herein.

SUMMARY OF THE INVENTION

A phase locked loop circuit includes a phase detection circuit, a means for phase adjustment, and a recovery circuit. The phase detection circuit monitors the phase relationship between two signals and communicates the phase relationship to the phase adjustment means. The phase adjustment means provides appropriate delay to one of the signals to synchronize the two signals. The recovery circuit monitors the phase adjustment means for synchronization failures and provides appropriate notice to the phase adjustment means. The phase locked loop circuit thus provides improved phase jitter resolution through the phase adjustment means and provides failure identification and correction through the recovery circuit resulting in improved circuit performance and reliability.

DETAILED DESCRIPTION OF THE PREFERRED EMBODIMENT

Figure 2:
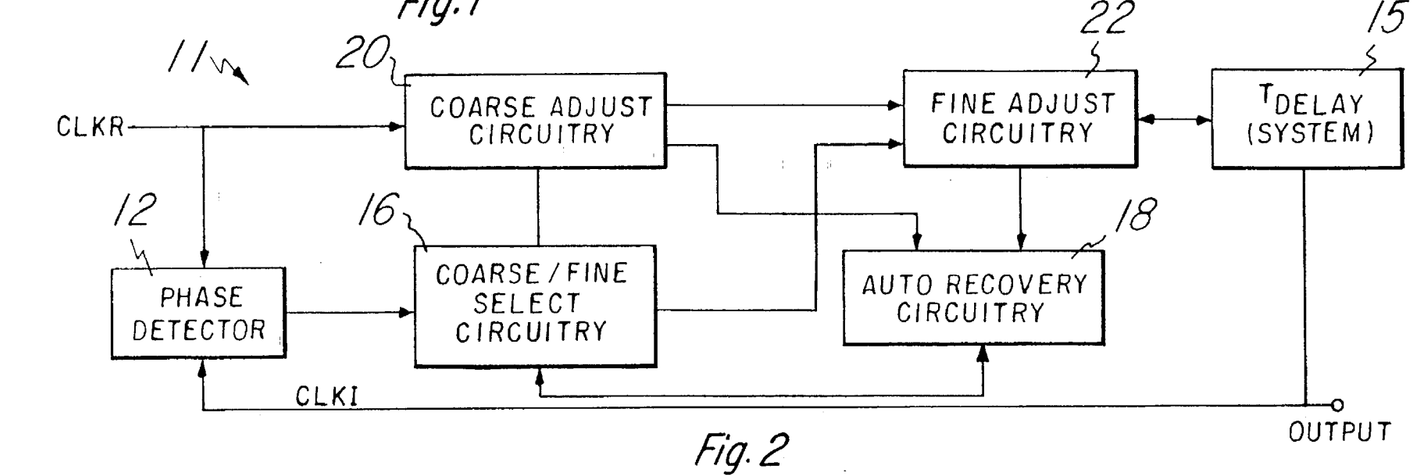
FIG. 2 is a block diagram illustrating the preferred embodiment of the invention, a phase locked loop circuit 11, PLL.

FIG. 2 is a block diagram illustrating the preferred embodiment of the invention, an improved digital phase locked loop circuit (DPLL) 11. DPLL 11 includes a phase detector circuit 12 that receives two signals, a reference clock signal CLKR and an internal clock signal CLKI and compares their phases. Reference clock signal CLKR may be, for example, generated by a crystal oscillator on a system board and have a frequency of about 50 Mhz. This invention, however, is not limited to this frequency, but may span a range of frequencies. Internal clock signal CLKI comes from internal circuitry of DPLL 11 that will now be described. The output of phase detector circuit 12 is connected to a course/fine select circuit 16. Course/fine select circuit 16 is connected to a course adjust circuit 20, a fine adjust circuit 22, and an auto recovery circuit 18. Further, auto recovery circuit 18 is connected to coarse adjust circuitry 20 and fine adjust circuitry 22. Fine adjust circuitry 22 returns internal clock signal CLKI to phase detector circuit 12 which will be explained in greater detail later. DPLL 11 provides improved performance over prior art PLL 10 through the addition of fine adjust circuitry 22, auto recovery circuitry 18, and coarse/fine select circuitry 16. Fine adjust circuitry 22 provides a unique method of providing extremely small duration delay steps thus greatly improving phase jitter performance. Auto recovery circuitry 18 and coarse/fine select circuitry 16 provide locking failure identification and control thus providing increased circuit reliability.

Figure 3:
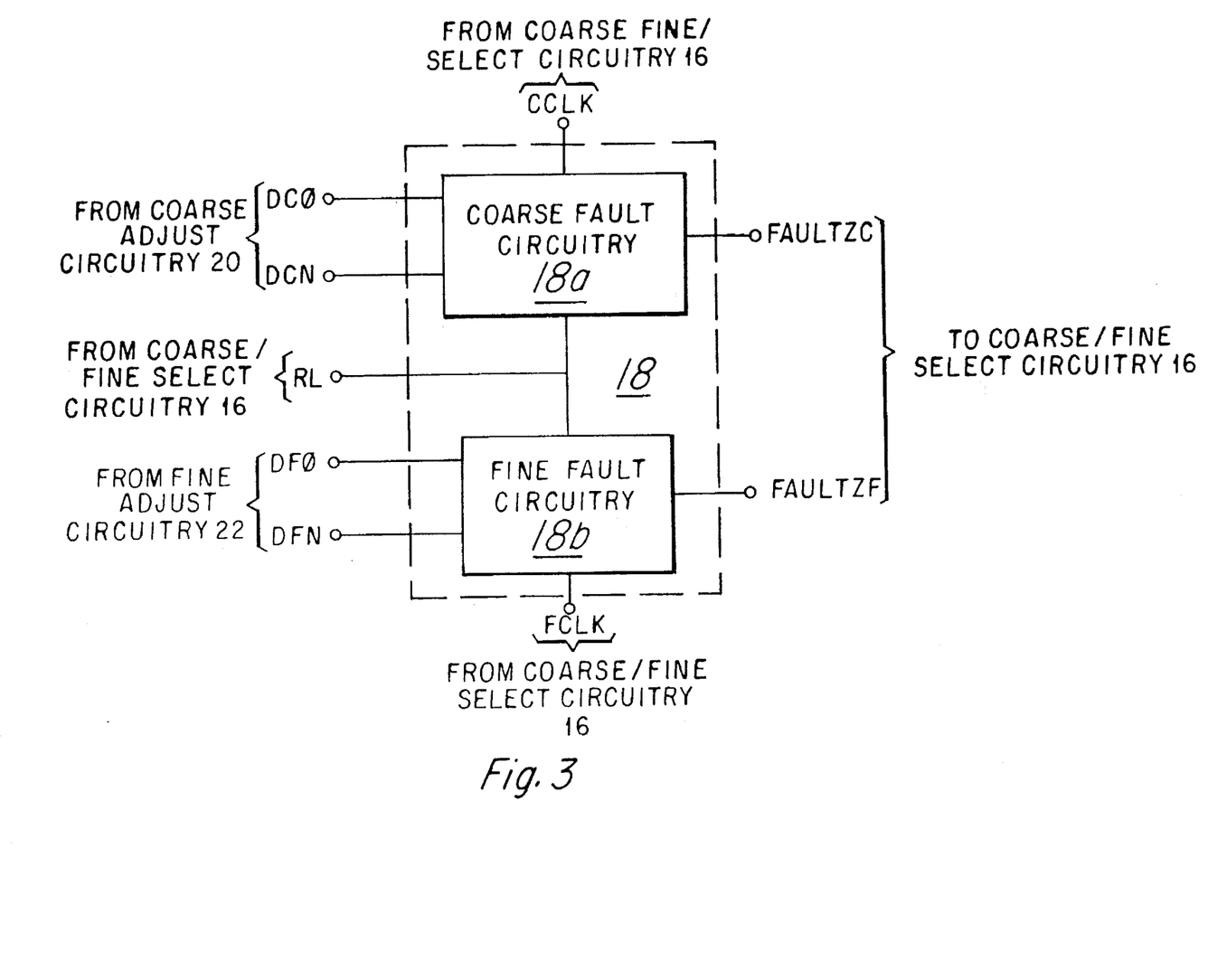
FIG. 3 is a block diagram illustrating auto recovery circuitry 18 of FIG. 2.

FIG. 3 is a block diagram illustrating auto recovery circuit 18 of FIG. 2. Auto recovery circuit 18 monitors coarse adjust circuit 20 and fine adjust circuit 22 for potential locking failures and communicates the failure status to coarse/fine select circuit 16. Auto recovery circuit 18 is composed of coarse fault circuitry 18a and fine fault circuitry 18b. Coarse fault circuitry receives inputs from coarse adjust circuit 20 (signals DC0 and DFN), signal RL from coarse/fine select circuitry 16, and CCLK signal from coarse/fine select circuitry 16. Fine fault circuitry 18breceives inputs from fine adjust circuitry 22 (signals DF0 and DFN), signal RL, and FCLK signal from coarse/fine select circuitry 16. Coarse fault circuitry 18a outputs a system reset signal FAULTZC which resets or "initializes", state 2 (S2) of FIG. 8, DPLL 11 when asserted. Fine fault circuitry 18b outputs a fault signal FAULTZF which returns DPLL 11 back to coarse adjust mode (state 3 (S3) or state 6 (S6) of FIG. 8 dependent upon signal RL which indicates whether delay is being added or deleted) when asserted which will be described later in detail.

Figure 4:
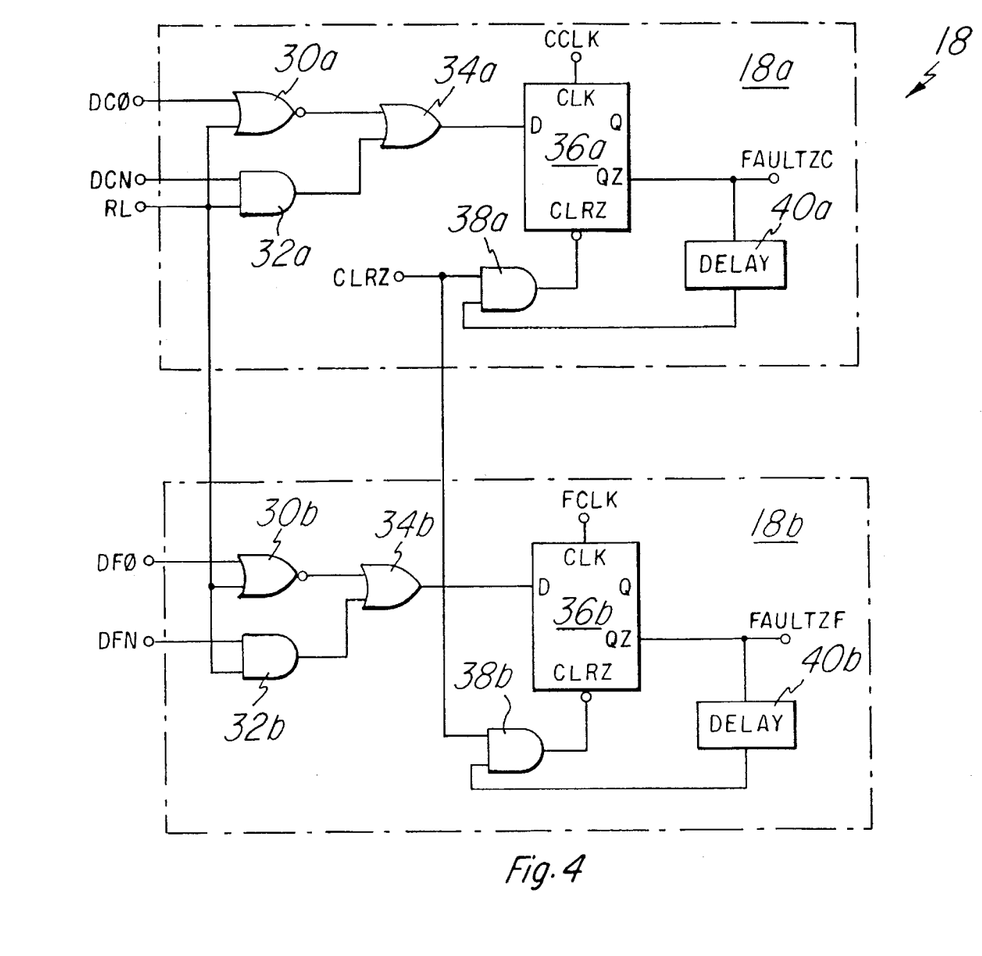
FIG. 4 is a schematic diagram illustrating an embodiment of auto recovery circuitry 18 of FIG. 3.

FIG. 4 is a schematic diagram illustrating in detail an embodiment of auto recovery circuitry 18. Auto recovery circuitry 18 takes as inputs delay status signals (DC0, DCN, DF0, and DFN) from coarse adjust circuitry 20 and fine adjust circuitry 22 and delay indication signal RL from phase detector 12 and outputs fault signals to coarse/fine select circuitry 16. As coarse fault circuitry 18a and fine fault circuitry 18b are similarly constructed, only circuit 18a will be described. RL signal is input to both a NOR gate 30a and an AND gate 32a. Delay signal DC0 is input to NOR gate 30a while delay signal DCN is input to AND gate 32a. The output of NOR gate 30a and AND gate 32a are fed into an OR gate 34a which feeds a "D" input to D-type flip flop 36a. The QZ output of flip flop 36a forms the FAULTZC signal and provides feedback through a delay element 40a which feeds an AND gate 38a. A clear signal CLRZ also inputs AND gate 38a. The output of AND gate 38a feeds the "clear" input of flip flop 36a.

Figure 5:
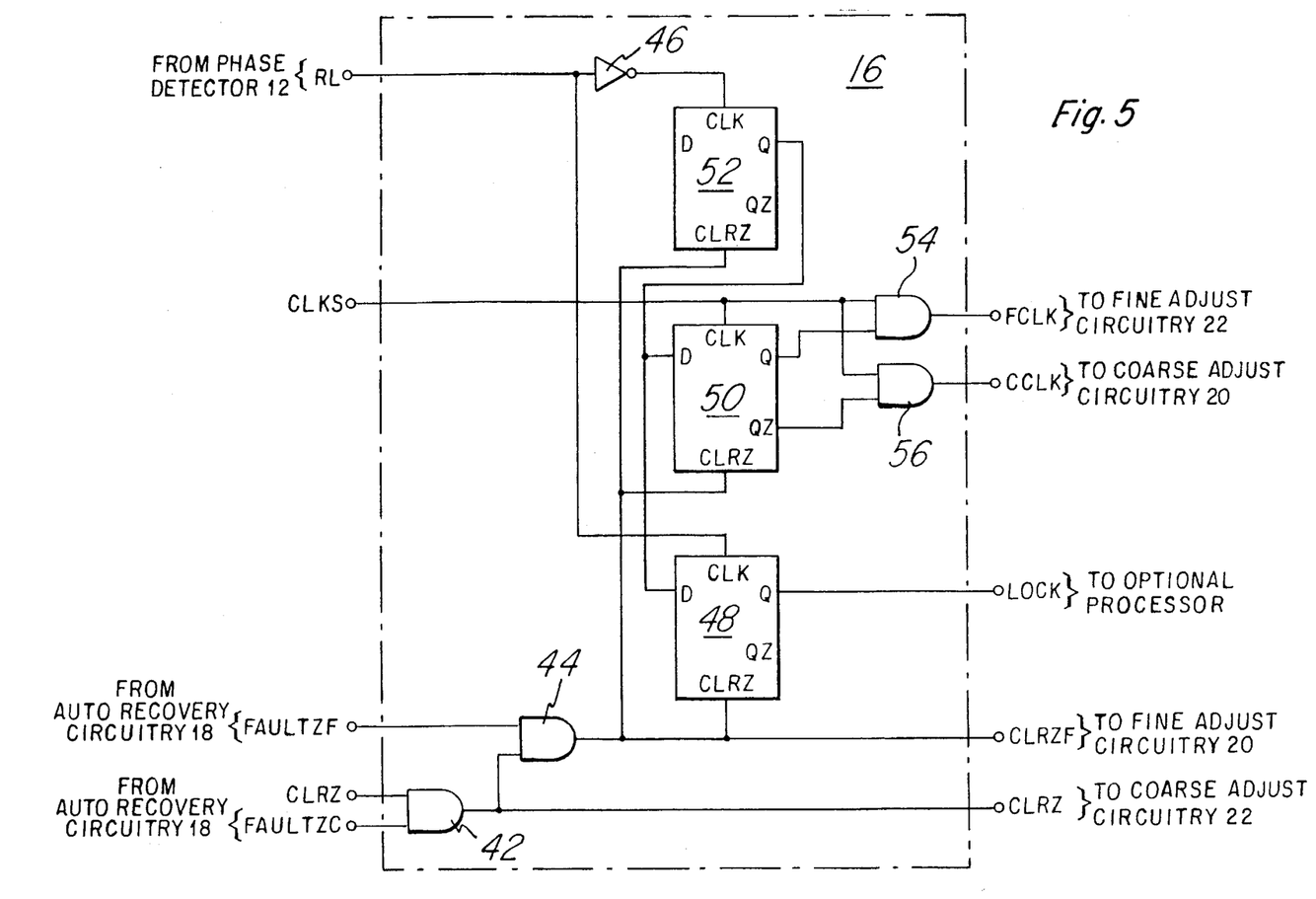
FIG. 5 is a schematic diagram illustrating coarse/fine select circuitry 16 of FIG. 2.

FIG. 5 is a schematic diagram illustrating in detail an embodiment of coarse/fine select circuitry 16. Coarse/fine select circuitry 16 takes as inputs the output signals from auto recovery circuitry 18, phase detector 12, clock signal CLKS (which is CLKR divided by four), and a system reset signal CLRZ and outputs signals to coarse adjust circuitry 20 and fine adjust circuitry 22. Also present is an output signal LOCK that may be optionally coupled to a system processor that is asserted if DPLL 11 suffers a locking failure (that is, if reference clock CLKR and internal clock CLKI do not become synchronized). LOCK is a signal which may be monitored by the system to determine whether the DPLL has the phase locked (as an interrupt for a CPU for example). The system processor can shut down operation until DPLL 11 does obtain locking at which time the LOCK signal may be reset thus allowing the system processor to resume its operations. This LOCK signal is optional and may be utilized at the discretion of the designer. Coarse/fine select circuitry 16 has a CLRZ signal and FAULTZF signal that form inputs to an AND gate 42. Signal FAULTZC and the output of AND gate 42 form inputs to AND gate 44. The output of AND gate 44 forms a "clear" input to three D-type flip flops 48, 50, and 52. RL signal from phase detector circuit 12 forms an input to an inverter 46 and a CLK input to flip flop 48. The output of inverter 46 feeds a CLK input of flip flop 52. The Q output of flip flop 52 forms the "D" inputs to flip flops 48 and 50. A CLKS signal forms a CLK input to flip flop 50 and inputs to AND gates 54 and 56. The Q output of flip flop 50 forms the second input to AND gate 54 while the QZ output of flip flop 50 forms the second input to flip flop 56.

Figure 6:
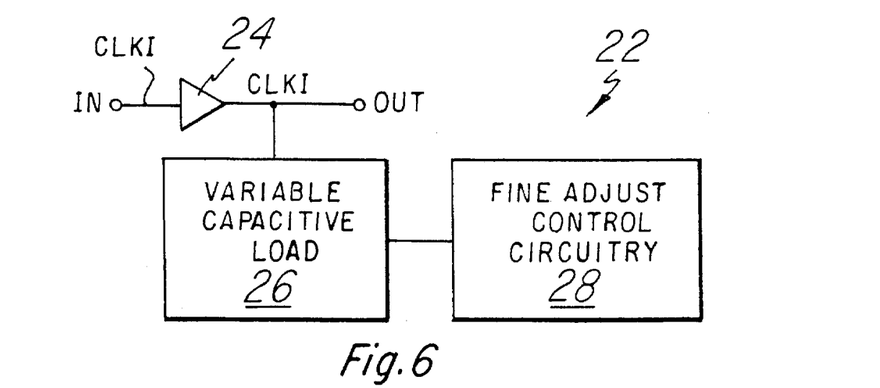
FIG. 6 is a logic/block diagram illustrating fine adjust circuitry 22 of FIG. 2.

FIG. 6 is a combined block/logic diagram illustrating the unique fine adjust circuitry 22 of FIG. 2. Fine adjust circuitry 22 consists of a buffer 24 connected to a variable capacitive load 26. Variable capacitive load 26 may vary its capacitance in either discrete values or in a continuous fashion. Variable capacitive load 26 is connected to a fine adjust control circuit 28. The input IN of buffer 24 is internal clock signal CLKI that has already been delayed by coarse adjust circuitry 20 and the output OUT of buffer 24 is CLKI delayed by fine adjust circuitry 22. An additional buffer may be placed on OUT to restore signal integrity. Fine adjust control circuitry 28 is connected to coarse/fine select circuitry 16 of FIG. 2 and controls variable capacitive load 26 which loads buffer 24 and provides a signal propagation delay between IN and OUT. Using variable capacitive load 26 to vary loading on buffer 24 uniquely allows fine adjust circuitry 22 to provide step delay increments of approximately 30 pS which differentiates DPLL 11 from prior art PLL 10 which exhibits phase jitter resolution an order of magnitude larger.

Figure 7:
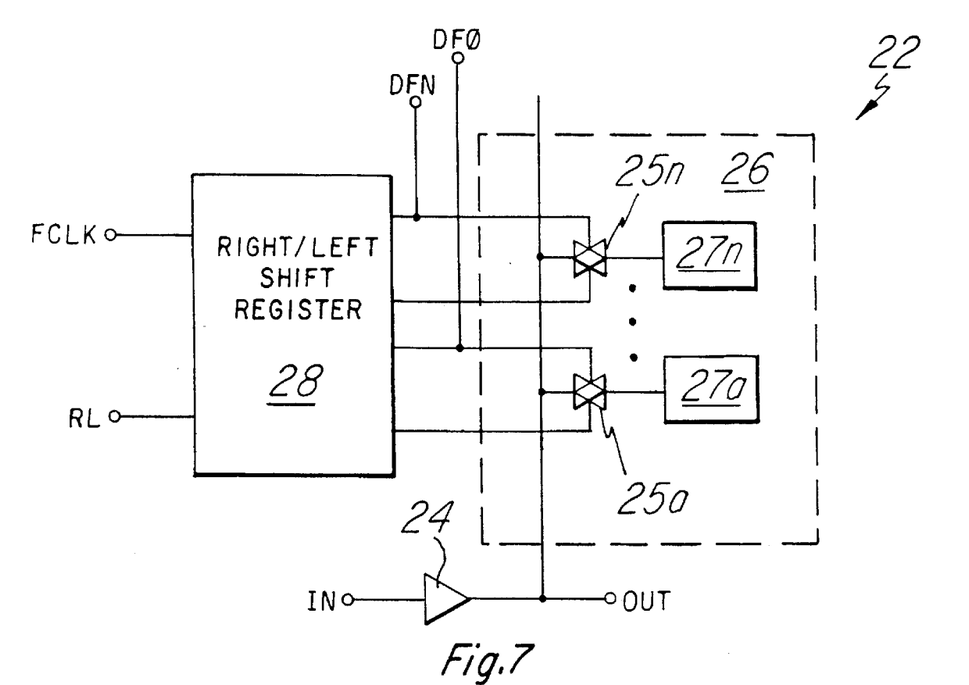
FIG. 7 is a schematic diagram illustrating fine adjust circuitry 22 of FIG. 8.

FIG. 7 is a schematic diagram illustrating in greater detail fine adjust circuitry 22 illustrated in FIG. 6. Specifically, it shows variable capacitive load 26 consisting of a plurality of pass gates 25a–25n coupled to a plurality of loads 27a–27n. Loads 27a–27n may, for example, be inverters or any element that provides a capacitive load such as a gate capacitance of one or a plurality of MOS transistors also, fine adjust control circuitry 28 shown in FIG. 6 is illustrated as a digital right/left shift register 28. Shift register 28 takes as inputs enable signal FCLK, directional shift signal RL, and reset signal CLRZF and outputs delay signal DF0, delay signal DFN, and a plurality of binary bits in parallel. A first output of the plurality of parallel binary bits is connected to a first enable input to pass gate 25a while a second output is connected to a second enable input to pass gate 25a. The plurality of outputs of shift register 28 are connected to the other pass gates 25b–25n and form first and second enable inputs respectively. Each pass gate 25a–25n has an input that is tied to the output OUT of buffer 24. Each pass gate 25a–25n also has an output connected to an input of a plurality of loads 27a–27n such that the output of pass gate 25a is connected to the input of load 27a and so on. The outputs of loads 27a–27n are connected together.

Figure 8:
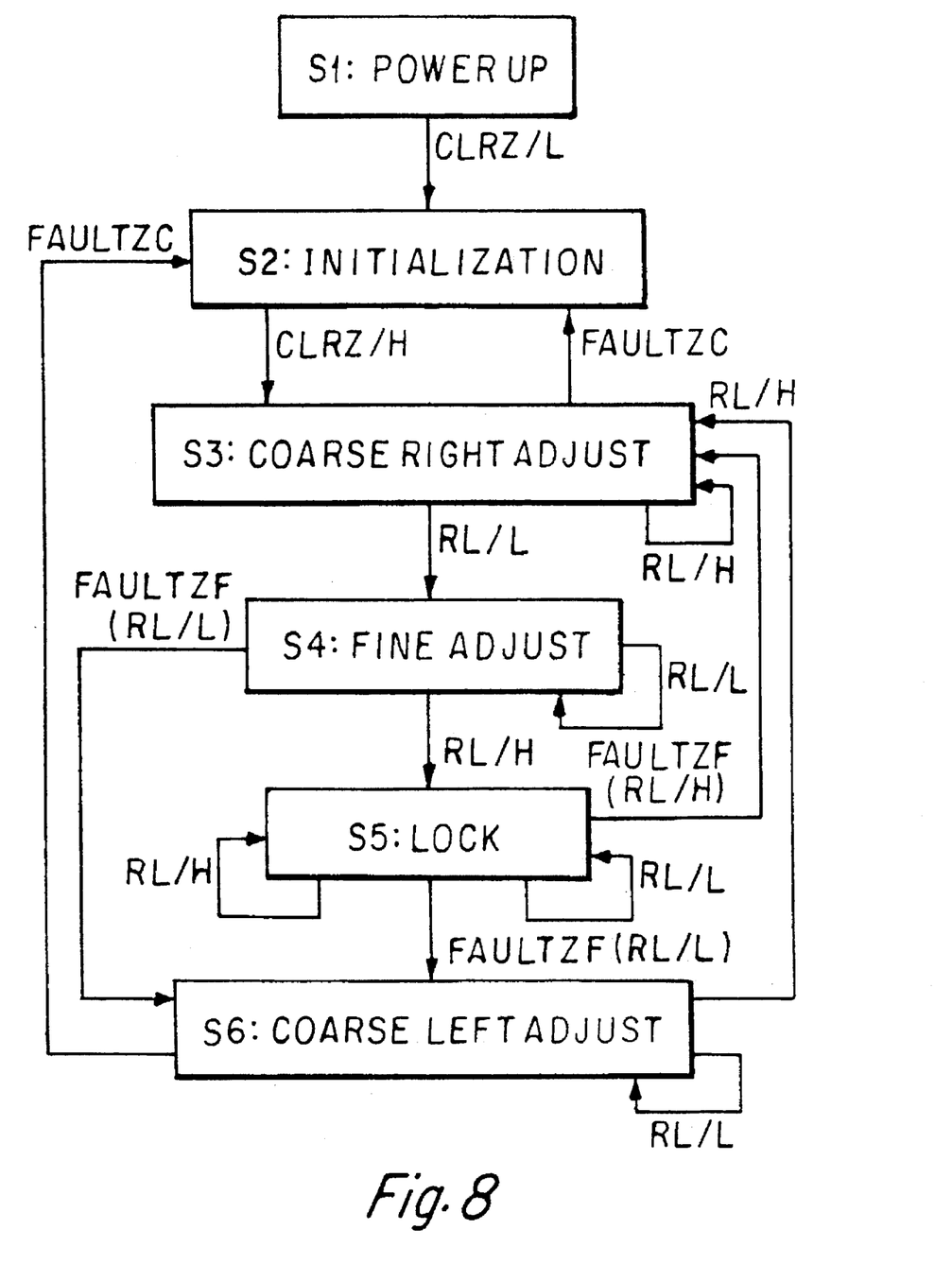
FIG. 8 is a state diagram of the circuit of FIG. 2.

A brief discussion of FIGS. 8, 9, 9a, and 9b relating to the overall operation of DPLL 11 is now provided. A more detailed discussion of the circuit's operation follow later herein. FIG. 8 is a state diagram illustrating the possible states of DPLL 11. State 1 consists of a power up state (S1) and state 2 consists of an initialization state (S2) which sets all adjust circuitry to predetermined delays. State 3 consists of a coarse right state (S3) which represents changing delays in course adjust circuit 20. State 4 consists of a fine adjust state (S4) which represents changing delays in fine adjust circuit 22. State 5 consists of a lock state (S5) which represents a phase lock condition, and state 6 consists of a coarse left state (S6) which represents changing delays in coarse adjust circuit 20. The difference between S6 and S3 is that the delay changes in S6 consist of decreasing the delay of internal clock CLKI while the delay changes in S3 consist of increasing the delay of internal clock CLKI. The arrows connected between the different states represent the potential state sequencing dependent upon the status of various control signals in DPLL 11. A system clear (signal CLRZ) at any state resets DPLL 11 to state S2.

Figure 9:
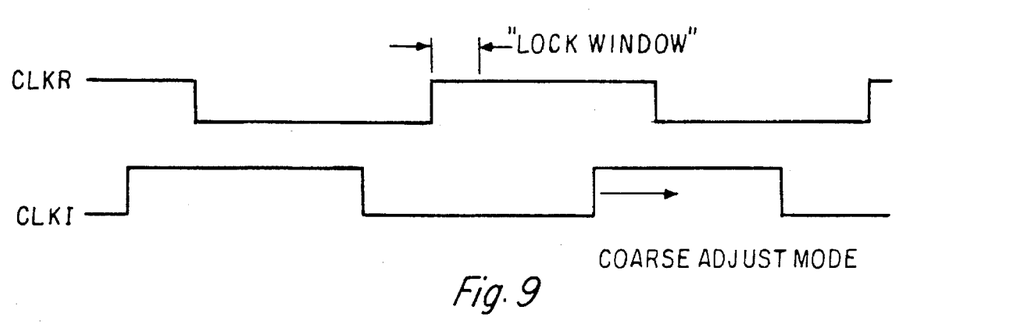
FIG. 9 is a timing diagram illustrating a coarse adjust mode condition of the circuit of FIG. 2.
Figure 9A:
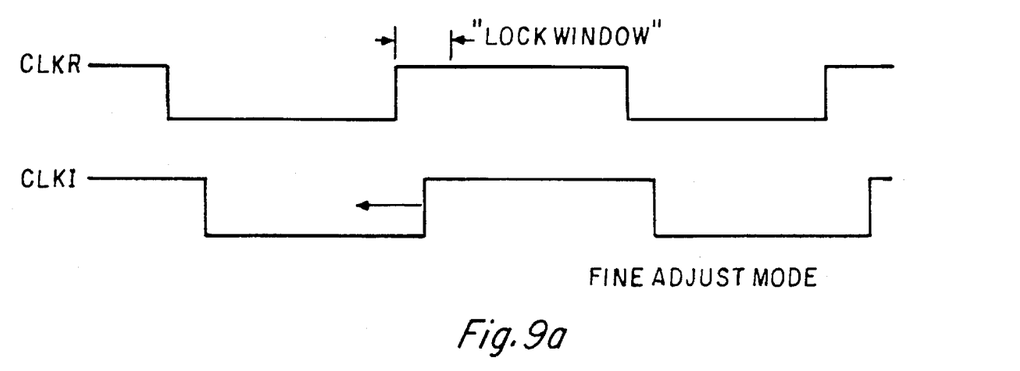
FIG. 9a is a timing diagram illustrating a fine adjust mode condition of the circuit of FIG.2.
Figure 9B:
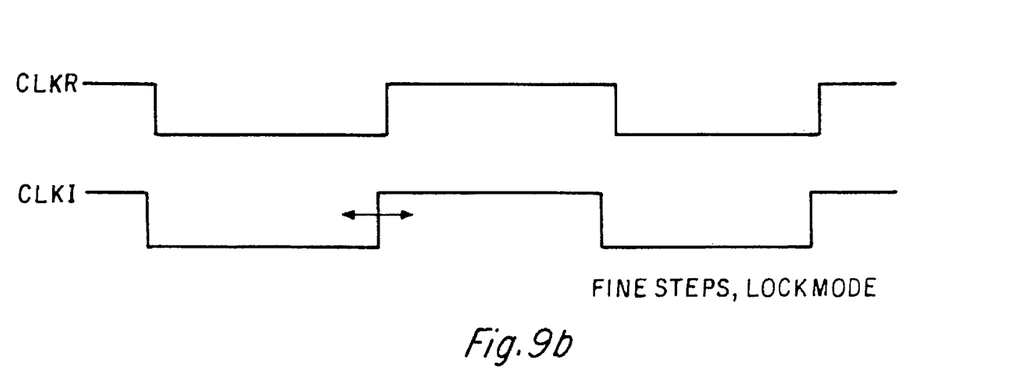
FIG. 9b is a timing diagram illustrating a lock mode condition of the circuit of FIG. 2.

FIG. 9 is a timing diagram illustrating reference clock CLKR and internal clock CLKI out of phase (or unsynchronized) and with DPLL 11 in coarse adjust mode (S3). This is a system condition occurrence before DPLL 11 synchronizes the two clocks. FIG. 9a is a timing diagram illustrating reference clock CLKR and internal clock CLKI in fine adjust mode (S4). Fine adjust mode (S4) is initiated once internal clock CLKI enters the "lock window". FIG. 9b is a timing diagram illustrating reference clock CLKR and internal clock CLKI in phase lock mode (S5).

The following is a detailed functional description of the invention with referenced to the state diagram of FIG. 8. At initialization (S2) DPLL 11 of FIG. 2 is reset which sets coarse adjust circuitry 20 at its minimum delay setting and fine adjust circuitry 22 at its mid-delay setting. RL, a signal originating from phase detector circuit 12, is a signal that indicates to coarse adjust circuitry 20 and fine adjust circuitry 22 whether to shift fight (increase delay) or shift left (decrease delay). RL signal is initialized high so that when DPLL 11 is reset coarse/fine select circuitry 16 will always begin increasing delay. At initialization (S2), a reset enable signal, CLRZ, is asserted. This situation is best shown in the timing diagram of FIG. 9. FIG. 9 illustrates the reference clock CLKR and the internal clock CLKI unsynchronized. DPLL 11 begins making coarse adjustments to CLKI (to the fight) by increasing the delay in CLKI.

In FIG. 9, when coarse delay adjustments are made, coarse/fine select circuitry 16 enables coarse adjust circuitry 20 with a signal CCLK. Coarse adjust circuitry 20 is described in detail in coassigned, pending application Ser. No. 07/898,981 (Docket No. TI-17062) and is hereby incorporated by reference. Coarse adjust circuitry 20 begins adding incremental delays onto internal clock CLKI. Each coarse delay increment is approximately 760 picoseconds (pS). Coarse adjust circuitry 20 continues adding incremental delay steps until the leading edge of internal clock CLKI passes the leading edge of reference clock CLKR and enters the "lock window" described in referenced application 07/898,981 (TI-17062) and illustrated in FIG. 9. The period of coarse adjustment where delay is being added to internal clock CLKI corresponds to state three (S3) in the state diagram of FIG. 8. When CLKI enters the "lock window", RL signal goes low which indicates to coarse/fine select circuitry 16 that internal clock CLKI has entered the "lock window". Coarse/fine select circuitry 16 then disables coarse adjust circuitry 20 by disasserting CCLK and enables fine adjust circuitry 22 by asserting enable signal CLKF. Fine adjust circuitry 22 begins incrementally decreasing delay in internal clock CLKI. Fine adjust circuitry 22 advantageously provides incremental delay steps of approximately 30 picoseconds (pS) which provides resolution improvement of over an order of magnitude over prior art digital phase locked loop 10 of FIG. 1. Fine adjust circuitry 22 will be explained in greater detail later. The period of fine adjustment corresponds to state four (S4) in the state diagram of FIG. 8. FIG. 9a also illustrates the appropriate timing diagrams of reference clock CLKR and internal clock CLKI during this period of time. Fine adjust circuitry 22 continues decreasing delay in approximately 30pS increments until the leading edge of internal clock CLKI crosses the leading edge of reference clock CLKR and exits the "lock window". RL signal will then be reasserted which then indicates that a "lock" has occurred. A "lock" indicates that the relative phases are within one fine step of one another. Once locked, CLKI will jitter about CLKR by one fine delay step. The LOCK signal output of coarse/fine select circuitry 20 will become asserted at this time. This signal may be connected to a system processor that would allow the system to know precisely when a lock has occurred. In this state internal clock CLKI will have incremental delays added and removed from it as CLKI "jitters" around the leading edge of reference clock CLKR. Since the incremental resolution of fine adjust circuitry 22 is approximately 30pS the jitter resolution of circuit 11 is approximately 30pS. This can be easily seen in the timing diagram of CLKR and CLKI in FIG. 9b.

DPLL 11 of FIG. 2 advantageously provides fault detection and fault recovery features. A fault is encountered when either coarse adjust circuitry 20 or fine adjust circuitry 22 are instructed to add further delay when either circuit has reached its maximum delay. A fault is also encountered when either circuit is instructed to decrease delay when either circuit has reached its minimum delay. When any of the above conditions exist DPLL 11 detects the fault, flags it, and takes appropriate corrective action as described below.

After initialization (S2), if reference clock CLKR and internal clock CLKI are, by random occurrence, nearly synchronized and if DPLL 11 is experiencing significant clock drift, internal clock CLKI may be moved to the right of the "lock window". Since coarse adjust circuitry 20 will continue adding delay until the leading edge of internal clock CLKI enters the "lock window" coarse adjust circuitry 20 will reach its maximum delay without entering the "lock window". When coarse adjust circuitry 20 reaches its maximum delay and DPLL 11 request additional delay a fault occurs. Coarse adjust circuitry 20 relays this fault condition to auto recovery circuit 18 which sends a reset signal FAULTZC to coarse/free select circuitry 16 which resets DPLL 1. 1. This corresponds to the FAULTZC loop in the state diagram of FIG. 8.

A second fault condition may occur during the fine adjust mode (S4). This condition occurs when internal clock CLKI has entered the "lock window" and has begun removing delay in small increments. Delay will continue to be removed until the leading edge of internal clock CLKI again crosses the leading edge of reference clock CLKR and exits the "lock window". If, however, fine adjust circuitry 22 reaches its minimum delay before internal clock CLKI exits the "lock window" a fault signal FAULTZF will be asserted and coarse/fine select circuitry 16 will enable coarse adjust circuitry 20 to remove delay which corresponds to the coarse left adjust mode (S6) in the state diagram of FIG. 8. DPLL 11 has been designed with sufficient delay to disallow this fault from occurring. However, due to unusual process or system conditions, clock drift may create unforeseen problems. This fault recovery function anticipates this problem.

Another similar fault condition may occur during the lock mode (S5). If, during lock, clock drift disallows fine adjust increments to lock internal clock CLKI and fine adjust circuitry 22 is at its minimum or maximum delay the fault signal FAULTZF is asserted and DPLL 11 is returned to coarse adjust circuitry 20 where it removes delay (S6) or adds delay (S3) as determined by the logic level of the RL signal. The effect of RL's logic level is illustrated in the state diagram of FIG. 8.

Lastly, a fault may occur in the coarse left adjust mode (S6). If a fault occurs during either the fine adjust mode (S4) or lock mode (S5) requiring coarse adjust circuitry 20 to remove delay and coarse adjust circuitry 20 is already at its minimum delay a fault signal FAULTZC is asserted which causes DPLL 11 to reset itself which corresponds to initialization (S2) in the state diagram of FIG. 8.

DPLL 11 advantageously provides improved phase jitter resolution of approximately 30pS because of novel fine adjust circuitry 22 shown in FIGS. 6 and 7. Fine adjust circuitry 22 provides small, incremental delays between input (IN) and output (OUT) by varying the capacitive loading on output (OUT) by manipulating variable capacitive load 26. Variable capacitive load 26 varies in capacitance dependant upon fine adjust control circuitry 28. When coarse/fine select circuitry 16 indicates a fine adjust mode (S4), fine adjust control circuitry 28 is enabled. Fine adjust control circuitry 28 then begins decreasing the delay between input (IN) and output (OUT) of fine adjust circuitry 22 by decreasing the capacitance of variable capacitive load 26. The decreased capacitance of variable capacitive load 26 decreases the signal propagation delay between IN and OUT due to the change in the RC time constant of the circuit 22. Fine adjust control circuitry 28 continues decreasing the capacitance of variable capacitive load 26 until the leading edge of internal clock CLKI exits the "lock window". RL signal (which controls whether fine adjust control circuitry 28 increases or decreases the capacitance of variable capacitive load 26) then transitions from low-to-high and fine adjust control circuitry begins adding delay between input (IN) and output (OUT) until the leading edge of internal clock CLKI again enters the "lock window". Fine adjust control circuitry 28 then continues to add and decrease delay so that the leading edge of internal clock CLKI "jitters" around the leading edge of reference clock CLKR as shown in FIG. 9b. This corresponds to the lock mode (S5) as shown in the state diagram of FIG. 8. Because fine adjust control circuitry 28 can make small adjustments of capacitance in variable capacitive load 26 the incremental change in delay caused by fine adjust circuitry 22 is approximately 30pS. This is known as the "jitter resolution" of DPLL 11. The "jitter resolution" of DPLL 11 is approximately an order of magnitude improvement over prior art solutions.

Turning now to FIG. 7, shift register 28 takes as inputs FCLK and RL and outputs DF0 and DFN in addition to a parallel string of binary values to variable capacitive load 26. FCLK is an enable signal from coarse/fine select circuitry 16 while RL, from phase detector circuit 12, indicates whether to increase or decrease delay. DF0 and DFN indicate the delay status of shift register 28 to auto recovery circuitry 18. DF0, when low, indicates that shift register 28 has forced variable capacitive load 26 to its lowest value and therefore its minimum delay. DFN, when high, indicates that shift register 28 has forced variable capacitive load 26 to its highest value and therefore its maximum delay. If DF0 and RL are low then fine adjust circuitry 22 is at its minimum delay and coarse/fine select circuitry 16 is requesting additional delay to be removed and auto recovery circuitry 18 will register a fault. If DFN and RL are both high then fine adjust circuitry 22 is at its maximum delay and coarse/fine select circuitry 16 is requesting additional delay to be added and auto recovery circuitry 18 also registers a fault.

Shift register 28 of FIG. 7 manipulates variable capacitive load 26 in the following manner. At initialization, S2 on the state diagram of FIG. 8, fine adjust circuitry 22 is set at middelay. This represents a specific value of the binary string formed by the parallel outputs of shift register 28. An appropriate binary sequence or value will enable a pass gate 25a thus placing the capacitive load of load 27a on output OUT of buffer 24. The binary value at initialization, S2, corresponds to a mid-level capacitive loading on output OUT of buffer 24. When shift register is enabled by CLKF shift register 28 will shift depending upon the value of RL. If RL is low, a low binary value "0" will be shifted rightwardly from the left, thus disabling a pass gate and decreasing the net capacitive loading on OUT. This results in a decreased delay between IN and OUT of circuit 22. If RL is high, a high binary value "1" will be shifted leftwardly from the right thus enabling another pass gate and increasing the net capacitive loading on OUT. This results in an increased delay between IN and OUT of circuit 22. The incremental delay between IN and OUT from a single pass gate being enabled is approximately 30pS which corresponds to the jitter resolution of DPLL 11.

DPLL 11 provides improved performance over prior art PLL 10 through the addition of fine adjust circuitry 22, auto recovery circuits 18, and coarse/fine select circuitry 16. Fine adjust circuitry 22 provides a unique method of providing extremely small duration delay steps thus greatly improving phase jitter performance. Auto recovery circuitry 18 and coarse/fine select circuitry 16 provide locking failure identification and control thus providing increased circuit reliability.

Although the invention has been described with reference to the embodiments herein, this description is not to be construed in a limiting sense. Various modifications of the disclosed embodiments will become apparent to Persons skilled in the an upon reference to the description of the invention. It is therefore contemplated that the appended claims will cover any such modifications or embodiments as fall within the true scope of the invention.

What is claimed is:

1. A phrase locked loop circuit, comprising:
    a phase detection circuit, wherein the phase detection circuit compares the phases of an internal signal and a reference signal, the reference signal forming an input and the internal signal forming an output of the phase locked loop circuit;
    means for phase adjustment connected to the phase detection circuit, wherein the means for phase adjustment further comprises:
        a variable delay adjust circuit, operable to adjust the phase of the internal signal in varying increments; and
        a phase adjust select circuit, operable to determine an appropriate delay increment for the variable delay adjust circuit in response to an indication from the phase detection circuit; and
    a recovery circuit connected to the phase adjustment means, wherein the recovery circuit resets the means for phase adjustment in an event of a locking failure, wherein the recovery circuit comprises:
        a first type fault detection circuit, operable to monitor the means for phase adjustments, detect fault conditions during a first type of phase adjustment, and reset the means for phase adjustment dependant upon fault conditions; and
        a second type fault detection circuit, operable to monitor the means for phase adjustment, detect fault conditions during a second type of phase adjustment that has smaller phase adjustments with respect to time than the first type of phase adjustment, and operable to reset the means for phase adjustment depending upon fault conditions.

2. A phase locked loop circuit, comprising:
    a phase detection circuit, wherein the phase detection circuit compares the phases of an internal signal and a reference signal, the reference signal forming an input and the internal signal forming an output of the phase locked loop circuit;

a coarse/fine mode select circuit connected to the phase detection circuit, operable to determine an appropriate delay increment in response to an indication from the phase detection circuit;

a coarse adjust mode circuit connected to the coarse/fine mode select circuit and said reference input operable to adjust the phase of the internal signal in a first delay increment;

a fine adjust mode circuit connected to the coarse/fine mode select circuit and said coarse adjust circuit operable to adjust the phase of the internal signal in a second delay increment, wherein the second delay increment is less than the first delay increment;

a recovery circuit connected to the coarse/fine mode select circuit, the coarse adjust mode circuit, and the fine adjust mode circuit, wherein the recovery circuit resets said phase detection circuit for phase adjustment in an event of a locking failure.

3. The circuit of claim 2 wherein the coarse/fine mode select circuit comprises:

means for resetting the coarse adjust mode circuit and the fine adjust mode circuit to predetermined delays in response to reset or fault indications; and means for selectively enabling either the coarse adjust mode circuit or the fine adjust mode circuit in response to phase conditions indicated by the phase detection circuit or fault conditions indicated by the recovery circuit.

4. The circuit of claim 2 wherein the fine adjust mode circuit comprises: a signal delay element;

a variable capacitive load connected to the signal delay element; and a control circuit connected to the variable capacitive load and the coarse/fine mode select circuit, operable to receive instructions from the coarse/fine mode select circuit and phase detection circuit and operable to manipulate the variable capacitive load in response to the instructions.

5. The circuit of claim 2 wherein the recovery circuit comprises:

means for receiving delay status data from the coarse adjust mode circuit, the fine adjust mode circuit, and coarse/fine mode select circuit; and means for indicating a fault to the coarse/fine mode select circuit in response to the delay status data.

6. A phase locked loop circuit, comprising:

a phase detection circuit, wherein the phase detection circuit compares the phases of an internal signal and a reference signal, the reference signal forming an input and the internal signal forming an output of the phase locked loop circuit;

a coarse/fine mode select circuit connected to the phase detection circuit, operable to determine an appropriate delay increment in response to an indication from the phase detection circuit;

a coarse adjust mode circuit connected to the coarse/fine mode select circuit, operable to adjust the phase of the internal signal in a first delay increment;

a fine adjust mode circuit connected to the coarse/fine mode select circuit, operable to adjust the phase of the internal signal in a second delay increment, wherein the second delay increment is less than the first delay increment; and a recovery circuit connected to the coarse/fine mode select circuit, the coarse adjust mode circuit, and the fine adjust mode circuit, wherein the recovery circuit resets the means for phase adjustment in an event of a locking failure, and wherein the recovery circuit comprises:

means for receiving delay status data from the coarse adjust mode circuit, the fine adjust mode circuit, and coarse/fine mode select circuit, wherein the means for receiving delay status data from the coarse adjust mode circuit comprises:

a first NOR gate having two inputs and an output, wherein the first input is connected to a first status signal is a high voltage value when coarse adjust mode circuit is at its minimum delay and a low voltage value otherwise and the second input is connected to a second status signal is a high voltage value when the phase detection circuit requests coarse adjust mode circuit to increase its delay and a low voltage value when the phase detection circuit requests coarse adjust mode circuit to decrease its delay and the output connected to the means for indicating a fault;

a first AND gate having two inputs and an output, wherein the first input is connected to the second status signal and the second input is connected to a third status signal that is a high voltage value when coarse adjust mode circuit is at its maximum delay and a low voltage value otherwise and the output connected to the means for indicating a fault; and means for indicating a fault to the coarse/fine mode select circuit in response to the delay status data.

7. The circuit of claim 6 wherein the means for indicating a fault to the coarse/fine mode select circuit in response to the delay status data comprises:

a first OR gate having two inputs and an output, wherein the first input is connected to the output of the first NOR gate and the second input is connected to the output of the first AND gate such that if either the first status signal and second status signal are both a low voltage value or the second status signal and third status signal are both a high voltage value a high voltage value will appear on the output of the first OR gate, which is coupled to a latching element that holds the voltage value, thus indicating a fault has occurred in the coarse adjust mode circuit.

8. The circuit of claim 6 wherein the means for receiving delay status data from the fine adjust mode circuit comprises:

a second NOR gate having two inputs and an output, wherein the first input is connected to a first status signal is a high voltage value when coarse adjust mode circuit is at its minimum delay and a low voltage value otherwise and the second input is connected to a second status signal is a high voltage value when the phase detection circuit requests fine adjust mode circuit to increase its delay and a low voltage value when the phase detection circuit requests fine adjust mode circuit to decrease its delay and the output connected to the means for indicating a fault; and a second AND gate having two inputs and an output, wherein the first input is connected to the second status signal and the second input is connected to a third status signal that is a high voltage value when fine adjust mode circuit is at its maximum delay and a low voltage value otherwise and the output connected to the means for indicating a fault.

9. The circuit of claim 8 wherein the means for indicating a fault to the coarse/fine mode select circuit in response to the delay status data comprises:

a second OR gate having two inputs and an output, wherein the first input is connected to the output of the second NOR gate and the second input is connected to the output of the AND gate such that if either the first status signal and second status signal are both a low voltage value or the second status signal and third status signal are both a high voltage value a high voltage value will appear on the output of the second OR gate thus indicating a fault has occurred in the fine adjust mode circuit.

* * * * *